United States Patent
Sakurai

(10) Patent No.: US 7,781,795 B2
(45) Date of Patent: Aug. 24, 2010

(54) GROUP III NITRIDE SEMICONDUCTOR DEVICE AND LIGHT-EMITTING DEVICE USING THE SAME

(75) Inventor: Tetsuo Sakurai, Chiba (JP)

(73) Assignee: Showa Denko K.K., Tokyo (JP)

( * ) Notice: Subject to any disclaimer, the term of this patent is extended or adjusted under 35 U.S.C. 154(b) by 193 days.

(21) Appl. No.: 10/583,336

(22) PCT Filed: Dec. 17, 2004

(86) PCT No.: PCT/JP2004/019458

§ 371 (c)(1),
(2), (4) Date: Jun. 19, 2006

(87) PCT Pub. No.: WO2005/062390

PCT Pub. Date: Jul. 7, 2005

(65) Prior Publication Data

US 2007/0138499 A1    Jun. 21, 2007

Related U.S. Application Data

(60) Provisional application No. 60/532,924, filed on Dec. 30, 2003.

(30) Foreign Application Priority Data

Dec. 22, 2003    (JP) .............................. 2003-425240

(51) Int. Cl.
*H01L 21/00* (2006.01)
(52) U.S. Cl. ............................ 257/103; 257/79; 257/98; 257/E27.012
(58) Field of Classification Search ................. 257/103, 257/79, 98, E27.012
See application file for complete search history.

(56) References Cited

U.S. PATENT DOCUMENTS

| 6,165,812 A * | 12/2000 | Ishibashi et al. ............... 438/46 |
| 6,442,184 B1 * | 8/2002 | Ota et al. .................. 372/43.01 |
| 2002/0155712 A1 * | 10/2002 | Urashima et al. ........... 438/689 |
| 2004/0113163 A1 * | 6/2004 | Steigerwald et al. .......... 257/88 |

FOREIGN PATENT DOCUMENTS

| JP | 4-297023 A | 10/1992 |
| JP | 6-151962 A | 5/1994 |

(Continued)

*Primary Examiner*—Cuong Q Nguyen
*Assistant Examiner*—Trang Q Tran
(74) *Attorney, Agent, or Firm*—Sughrue Mion, PLLC

(57) ABSTRACT

An object of the present invention is to provide a Group III nitride semiconductor device exhibiting improved crystallinity and a good performance. The inventive Group III nitride semiconductor device comprises a substrate, and a plurality of Group III nitride semiconductor layers provided on the substrate, wherein a first layer which is in contact with the substrate is composed of silicon-doped $Al_xGa_{1-x}N$ ($0 \leq x \leq 1$). Also, the inventive Group III nitride semiconductor device comprises a substrate, and a plurality of Group III nitride semiconductor layers provided on the substrate, wherein a first layer which is in contact with the substrate is composed of $Al_xGa_{1-x}N$ ($0 \leq x \leq 1$), and the difference in height between a protrusion and a depression which are present at the interface between the first layer and a second layer provided thereon is 10 nm or more and is equal to, or less than, 99% the thickness of the first layer.

20 Claims, 5 Drawing Sheets

FOREIGN PATENT DOCUMENTS

| | | | |
|---|---|---|---|
| JP | 10-125608 A | | 5/1998 |
| JP | 08282524 | * | 5/1998 |
| JP | 2002-100575 A | | 4/2002 |
| JP | 2002-261032 A | | 9/2002 |
| JP | 2002-313739 A | | 10/2002 |
| JP | 2003-63895 A | | 3/2003 |
| JP | 2003-171200 A | | 6/2003 |
| WO | WO 00/04615 A1 | | 1/2000 |
| WO | WO 02/17369 A1 | | 2/2002 |

* cited by examiner

GROUP III NITRIDE SEMICONDUCTOR DEVICE AND LIGHT-EMITTING DEVICE USING THE SAME

CROSS REFERENCE TO RELATED APPLICATION

This application is an application filed under 35 U.S.C. §111(a) claiming benefit, pursuant to 35 U.S.C. §119(e) (1), of the filing date of the Provisional Application No. 60/532,924 filed on Dec. 30, 2003, pursuant to 35 U.S.C. §111(b).

TECHNICAL FIELD

The present invention relates to a Group III nitride semiconductor device, exhibiting good crystallinity, which is employed in, for example, light-emitting diodes, laser diodes, and electronic devices.

BACKGROUND ART

Group III nitride semiconductors have a direct transition band structure and exhibit bandgap energies corresponding to the energy of visible to ultraviolet light. By virtue of these characteristics, Group III nitride semiconductors are employed at present for producing light-emitting devices, including blue LEDs, blue-green LEDs, ultraviolet LEDs, and white LEDs (which contain a fluorescent substance in combination with such a nitride semiconductor).

Growing only a nitride-single crystal itself has been considered difficult, for the following reasons. Nitrogen, which is a constituent of the single crystal, has high dissociation pressure and therefore fails to be retained in the single crystal in, for example, the pulling method.

Therefore, a Group III nitride semiconductor is generally produced by means of metal organic chemical vapor deposition (MOCVD). In this technique, a single-crystal substrate is placed on a heatable jig provided in a reaction space, and raw material gases are fed onto the surface of the substrate, to thereby grow, on the substrate, an epitaxial film of nitride semiconductor single crystal. The single-crystal substrate is formed of, for example, sapphire or silicon carbide (SiC). However, even when a nitride semiconductor single crystal is grown directly on such a single-crystal substrate, large amounts of crystal defects, which are attributed to crystal lattice mismatch between the crystalline substrate and the single crystal, are generated in the resultant nitride semiconductor single crystal film; i.e., the epitaxial film fails to exhibit good crystallinity. In view of the foregoing, there have been proposed several methods for growing, between a substrate and a nitride semiconductor single crystal epitaxial film, a layer having a function for suppressing generation of crystal defects (i.e., a layer corresponding to a buffer layer), so as to attain good crystallinity of the epitaxial film.

In one typical method, an organometallic raw material and a nitrogen source are simultaneously fed onto a substrate at a temperature of 400 to 600° C., to thereby form a low-temperature buffer layer; the thus-formed buffer layer is subjected to thermal treatment (i.e., crystallization) at an increased temperature; and a target Group III nitride semiconductor single crystal is epitaxially grown on the resultant buffer layer (see Japanese Patent Application Laid-Open (kokai) No. 2-229476). Also, there has been proposed a method including a first step of depositing fine Group III metal particles onto the surface of a substrate; a second step of nitridizing the fine particles in an atmosphere containing a nitrogen source; and a third step of growing a target Group III nitride semiconductor single crystal on the thus-nitridized fine particles (see International Publication WO 02/17369 Pamphlet).

Such a method can produce a Group III nitride semiconductor single crystal exhibiting somewhat good crystallinity. However, with an aim to further improve in the performance of a semiconductor device, demand still exists for a Group III nitride semiconductor crystal exhibiting further enhanced crystallinity.

Important factors for evaluating the performance of a semiconductor light-emitting device are, for example, emission wavelength, emission intensity and forward voltage under application of rated current, and reliability of the device. A key indicator for determining such a reliability is whether or not current flows under application of reverse voltage (not forward voltage) to the device; i.e., the magnitude of the threshold voltage at which reverse current begins to flow. Such threshold voltage is called "reverse withstand voltage." In recent years, demand has arisen for a semiconductor light-emitting device exhibiting higher reverse withstand voltage and, accordingly, a further improvement in crystallinity is required.

DISCLOSURE OF INVENTION

An object of the present invention is to provide a Group III nitride semiconductor device exhibiting improved crystallinity and good performance. Another object of the present invention is to provide a Group III nitride semiconductor light-emitting device exhibiting high reverse withstand voltage; i.e., a high threshold voltage at which a reverse current begins to flow.

The present invention provides the following.
(1) A Group III nitride semiconductor device comprising a substrate, and a plurality of Group III nitride semiconductor layers provided on the substrate, wherein a first layer which is in contact with the substrate is composed of silicon-doped $Al_xGa_{1-x}N$ ($0 \leq x \leq 1$).
(2) A Group III nitride semiconductor device according to (1) above, wherein the first layer contains silicon in an amount of $1 \times 10^{16}$ to $1 \times 10^{19}$ atoms/cm$^3$.
(3) A Group III nitride semiconductor device comprising a substrate, and a plurality of Group III nitride semiconductor layers provided on the substrate, wherein a first layer which is in contact with the substrate is composed of $Al_xGa_{1-x}N$ ($0 \leq x \leq 1$), and the difference in height between a protrusion and a depression which are present at the interface between the first layer and a second layer provided thereon is 10 nm or more and is equal to, or less than, 99% the thickness of the first layer.
(4) A Group III nitride semiconductor device according to any one of (1) through (3) above, wherein the first layer has a structure formed of aggregated columnar crystal grains.
(5) A Group III nitride semiconductor device according to (4) above, wherein each of the columnar crystal grains has a width of 10 to 100 nm.
(6) A Group III nitride semiconductor device according to any one of (1) through (5) above, wherein the first layer has a thickness of 20 nm to 200 nm.
(7) A Group III nitride semiconductor light-emitting device comprising a substrate; an n-type layer, a light-emitting layer, and a p-type layer, which are composed of a Group III nitride semiconductor single crystal and are provided on the substrate in this order; a negative electrode provided on the n-type layer; and a positive electrode provided on the p-type layer, wherein there is a layer composed of silicon-doped $Al_xGa_{1-x}N$ ($0 \leq x \leq 1$) in contact with the substrate.

(8) A Group III nitride semiconductor light-emitting device according to (7) above, wherein the silicon-doped $Al_xGa_{1-x}N$ ($0 \leq x \leq 1$) layer has a structure formed of aggregated columnar crystal grains.

(9) A method for producing a Group III nitride semiconductor device, which method comprises a first step of depositing, on the surface of a substrate, a layer containing fine Group III metal particles containing silicon; a second step of nitridizing the fine particles in an atmosphere containing a nitrogen source; and a third step of growing a Group III nitride semiconductor single crystal on the thus-nitridized fine particles.

(10) A method for producing a Group III nitride semiconductor device according to (9) above, which further comprises, between the first and second steps, an annealing step of heating the fine particles in an atmosphere containing hydrogen gas and/or nitrogen gas.

According to the present invention, there are obtained a Group III nitride semiconductor device of improved crystallinity, and a Group III nitride semiconductor light-emitting device exhibiting high reverse withstand voltage; i.e., a high threshold voltage at which reverse current begins to flow.

BEST MODE FOR CARRYING OUT THE INVENTION

The Group III nitride semiconductor device provided by the present invention includes a substrate, and a plurality of Group III nitride semiconductor layers provided on the substrate. A characteristic feature of the semiconductor device resides in that a first layer composed of $Al_xGa_{1-x}N$ ($0 \leq x \leq 1$) which is in contact with the substrate is doped with Si. The composition of the first layer, which is formed of a compound containing N, and Al and/or Ga, may be appropriately determined in accordance with the type of a Group III nitride semiconductor single crystal constituting second and subsequent layers which are to be grown on the first layer. The first layer may be formed solely of AlN (i.e., a compound containing no Ga), or solely of GaN (i.e., a compound containing no Al).

Preferably, the first layer has a structure formed of aggregated columnar crystal grains. As used herein, the term "columnar crystal grain" refers to a crystal grain which has a columnar vertical cross section and is separated from an adjacent crystal grain by a grain boundary formed therebetween.

Figure 1:
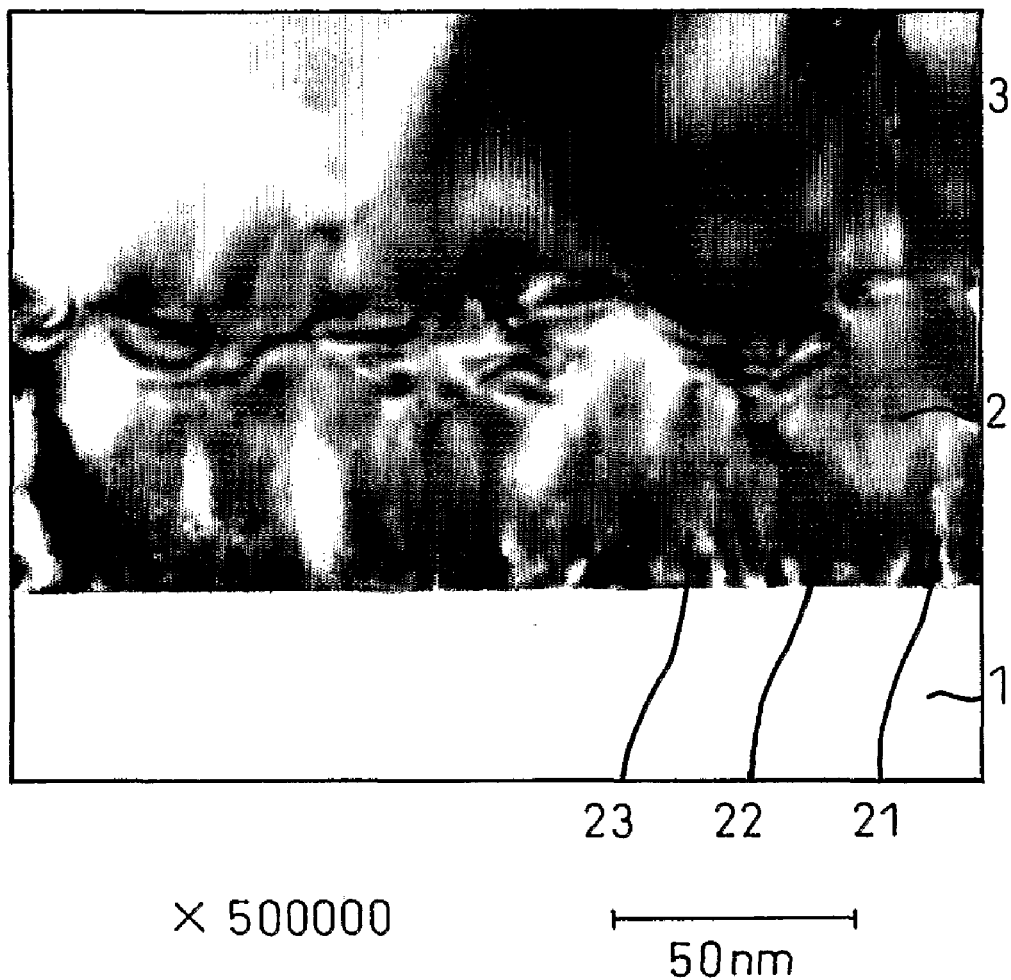
FIG. 1 is an electron micrograph showing the cross section of the Group III nitride semiconductor light-emitting device of Example.
Figure 2:
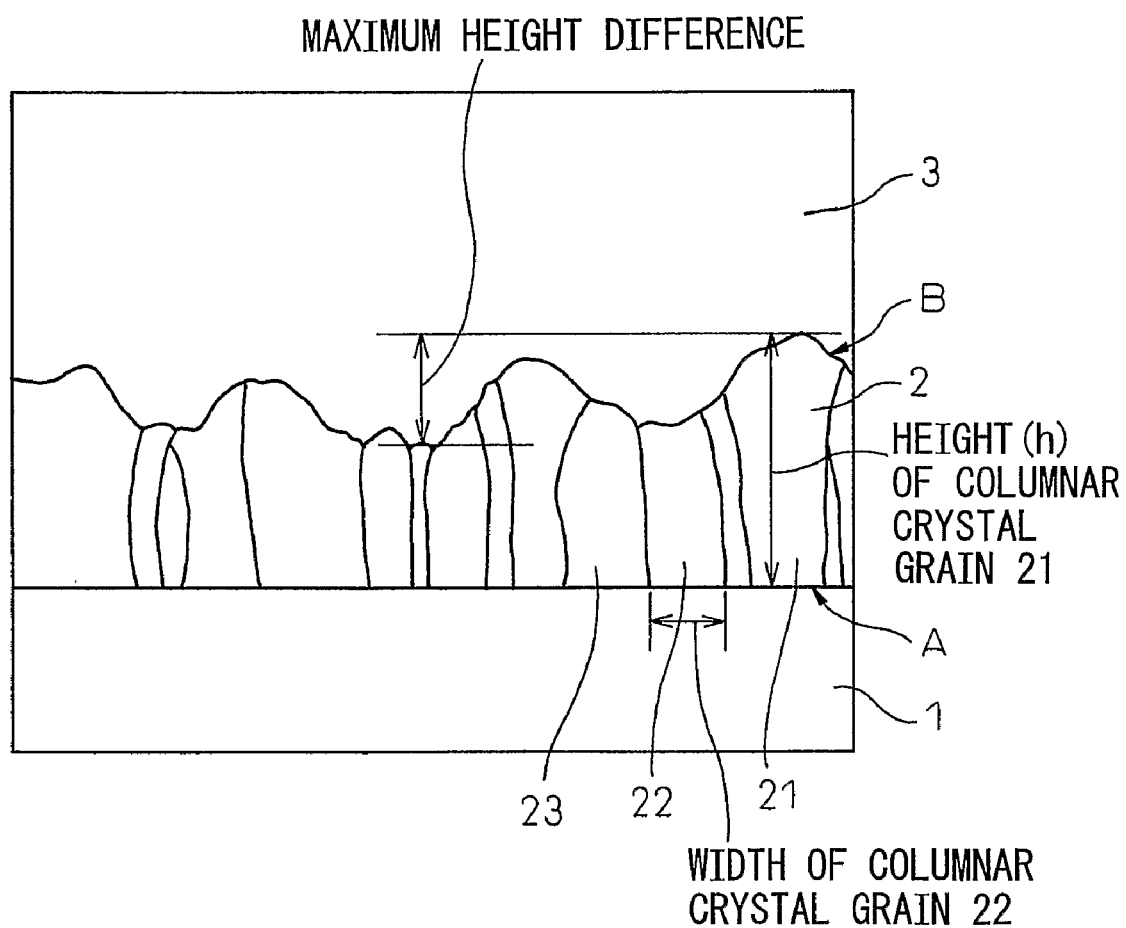
FIG. 2 is a schematic representation of the micrograph shown in FIG. 1.

FIG. 1 is an electron micrograph showing the cross section of a light-emitting device of Example 1, and FIG. 2 is a schematic representation of the electron micrograph shown in FIG. 1. Reference numeral 1 denotes a substrate, 2 a first layer, and 3 a second layer which is grown on the first layer and is formed of undoped GaN single crystal. These figures show that the first layer is formed of aggregated columnar crystal grains. Reference numerals 21, 22, and 23 denote columnar crystal grains.

The second layer 3, which is formed of undoped GaN single crystal, is epitaxially grown on the first layer 2, and epitaxial growth of the second layer starts at several columnar crystal grains selected from among all the crystal grains constituting the first layer. The columnar crystal grains at which the layer growth starts are selected in accordance with the shape of the surface of the first layer; specifically, the difference in height between adjacent columnar crystal grains of the first layer.

As used herein, the expression "the height (h) of a columnar crystal grain" is defined by the distance between the upper surface A of the substrate 1 and the interface B between the first and second layers as measured, through observation under an electron microscope, at a position where the columnar crystal grain, which constitutes the first layer, is present (see FIGS. 1 and 2). The absolute value of the height (h) of the columnar crystal grain is calculated on the basis of the magnification of the electron microscope during the course of observation. The difference in height between the highest columnar crystal grain and the lowest columnar crystal grain constituting the first layer of a sample, which difference is measured by use of a electron micrograph (size: 10 cm) captured at an arbitrary portion of the first layer at a magnification of 500,000, is defined as the maximum difference in height between protrusions and depressions present at the surface of the first layer of the sample (i.e., the maximum difference in height between protrusions and depressions present at the interface between the first and second layers of the sample).

The conditions of the surface of the first layer may be an important factor for determining the crystallinity of a Group III nitride semiconductor single crystal layer to be grown on the first layer, although the crystallinity of the single crystal layer may be affected by the growth conditions therefor.

The present inventor has found that the maximum difference in height between protrusions and depressions present at the surface of the first layer is preferably 10 nm or more and is equal to, or less than, 99% the thickness of the first layer, more preferably 10 nm or more and equal to or less than 90% the thickness of the first layer. When the maximum height difference falls within the above range, a Group III nitride semiconductor single crystal of good crystallinity is epitaxially grown on the first layer. When the maximum height difference is smaller than 10 nm, single crystal growth starts at a greater number of selected crystal grains, which is not desirable from the viewpoint of control of the crystal growth. In contrast, when the maximum height difference is excessively large, a Group III nitride semiconductor single crystal having a mirror surface fails to be obtained. Thus, the maximum height difference is preferably 60 nm or less, more preferably 40 nm or less.

When the width of the columnar crystal grains (see FIG. 2) is small, epitaxial growth of a Group III nitride semiconductor single crystal starts at numerous columnar crystal grains, possibly leading to crystal growth in different orientations; i.e., random crystal growth. Therefore, the columnar crystal grain width is preferably 10 nm or more. However, when the columnar crystal grain width is excessively large, single crystal growth fails to start at the columnar crystal grains. Therefore, the columnar crystal grain width is preferably 100 nm or less. The columnar crystal grain width is more preferably 20 to 60 nm, particularly preferably 20 to 40 nm.

The present inventor has found that when the first layer is doped with silicon, the maximum difference in height between protrusions and depressions present at the surface of the first layer becomes 10 nm or more. In the case where the first layer is not doped with silicon, the maximum difference in height between protrusions and depressions present at the surface of the first layer becomes smaller than 10 nm, and therefore, the crystallinity of a Group III nitride semiconductor to be grown on the first layer is deteriorated as compared with the case where the first layer is doped with silicon. The doping amount of silicon is preferably $1 \times 10^{16}$ to $1 \times 10^{19}$ atoms/cm$^3$, more preferably $1 \times 10^{16}$ to $1 \times 10^{18}$ atoms/cm$^3$, particularly preferably $1 \times 10^{16}$ to $5 \times 10^{17}$ atoms/cm$^3$. When the silicon doping amount is less than $1 \times 10^{16}$ atoms/cm$^3$, the considerable effects of silicon doping are not obtained, whereas when the silicon doping amount is more than $1 \times 10^{19}$ atoms/cm$^3$, the columnar crystal grains fail to be maintained, which is not preferred.

The thickness of the first layer is an important parameter. Within the context of the present invention, the thickness of the thickest portion of the first layer is defined as the thickness of the first layer, although protrusions and depressions are present at the interface between the first and second layers; i.e., the thickness of the first layer differs from portion to portion. The thickness of the first layer is preferably 20 nm or more, more preferably 40 nm or more. When the thickness is smaller than 20 nm, difficulty is encountered in securing the difference in height between protrusions and depressions present at the surface of the first layer. No particular limitations are imposed on the maximum value of the thickness of the first layer. However, even when the thickness of the first layer is increased to 200 nm or more, epitaxial growth of a Group III nitride semiconductor crystal on the first layer is not considerably affected by the layer thickness. In addition, when the thickness of the first layer is to be increased to a level more than necessary, a long period of time is required for growth thereof, which is not desirable. The thickness of the first layer is preferably regulated to 100 nm or less.

The composition and configuration of the second and subsequent Group III nitride semiconductor layers, which are to be grown on the first layer, are appropriately selected in accordance with the intended use of the resultant semiconductor device. For example, in the case where the semiconductor device is a light-emitting device, an n-type layer, a light-emitting layer, and a p-type layer are formed on the first layer in this order, and a negative electrode and a positive electrode are formed on the n-type layer and the p-type layer, respectively.

As for the second and subsequent Group III nitride semiconductor layers, conventionally known gallium nitride-based compound semiconductors represented by formula: $Al_xGa_yIn_{1-x-y}N$ ($0 \leq x \leq 1$, $0 \leq y \leq 1$, $x+y \leq 1$) may be employed.

No particular limitations are imposed on the method for forming these Group III nitride semiconductor layers, and there may be employed any known method for growing a Group III nitride semiconductor, such as MOCVD (metal organic chemical vapor deposition), HVPE (hydride vapor phase epitaxy), or MBE (molecular beam epitaxy). From the viewpoints of layer thickness controllability and mass productivity, MOCVD is preferably employed.

In the case where the Group III nitride semiconductor layers are grown by means of MOCVD, hydrogen ($H_2$) or nitrogen ($N_2$) is employed as a carrier gas. Such a carrier gas is caused to pass through a purification apparatus for removing, for example, oxygen or moisture, and then fed into a reactor. Through valve switching, and under the control of a mass flow controller, the composition of the carrier gas can be rapidly changed from 100% nitrogen to 100% hydrogen. The carrier gas to be fed into the reactor may be a gas mixture of nitrogen and hydrogen. In this case, the compositional proportions of nitrogen and hydrogen can be arbitrarily determined.

Examples of the Group III metal source to be employed include organometallic compounds such as trimethylgallium (TMGa), triethylgallium (TEGa), trimethylaluminum (TMAl), triethylaluminum (TEAl), trimethylindium (TMIn), and triethylindium (TEIn), which are appropriately determined in accordance with the composition of the respective semiconductor layers. Such an organometallic compound is sealed in a cylindrical metallic container, and the container is placed in a thermostatic chamber whose temperature can be maintained at a predetermined level. A Group III metal source is fed into the reactor as described below.

When a carrier gas is fed into the metallic container through a metallic tube provided in the container, the Group III metal source is subjected to bubbling in the container by means of the thus-fed carrier gas, and the vapor of the metal source is contained in the carrier gas. The carrier gas containing the organometallic compound (Group III metal source) is fed into the reactor through an automatically openable/closable valve under control of a mass flow controller. As used herein, "mass flow controller" refers to an apparatus enabling to feed, into the reactor, a necessary amount of the metal source to be employed. In the present invention, the mass flow controller can be used for feeding of the Group III metal source and the carrier gas employed.

The nitrogen source to be employed is preferably ammonia ($NH_3$), hydrazine ($N_2H_4$), or a similar material. In the case where the nitrogen source is ammonia, ammonia gas obtained through vaporization of liquid ammonia contained in a cylinder is employed. The feed amount of the ammonia gas is regulated to a predetermined level through flow rate control by means of a mass flow controller, and the ammonia gas is fed into the reactor through a metallic tube capable of feeding the ammonia gas together with a carrier gas, and through an automatically openable/closable valve.

The n-type dopant to be employed may be, for example, monosilane ($SiH_4$), disilane ($Si_2H_6$), or germane ($GeH_4$), whereas the p-type dopant to be employed may be, for example, bis(cyclopentadienyl)magnesium ($Cp_2Mg$) or bis (ethylcyclopentadienyl)magnesium ($EtCp_2Mg$). When monosilane is employed, it is fed into the reactor in a manner similar to the case of ammonia, whereas when $Cp_2Mg$ is employed, it is fed into the reactor in a manner similar to the case of the organometallic source.

The reactor is heated by means of heating a carbon-made susceptor on which a substrate is to be placed, which susceptor generates heat through induction current generated therein by applying electricity to an induction heating RF coil provided below the susceptor. The temperature of the susceptor is measured by means of a pyrometer provided in the vicinity of the bottom surface of the susceptor, and the thus-measured temperature data are converted into control signals. The control signals are sent to a feedback mechanism for supplying electric power to the RF coil, whereby the susceptor temperature is controlled to a predetermined level.

Preferably, the first layer is formed by means of the method including a first step of depositing silicon-containing fine Group III metal particles onto the surface of a substrate, and a second step of nitridizing the fine particles in an atmosphere containing a nitrogen source. More preferably, an annealing step for heating the fine particles in a carrier gas atmosphere is carried out between the first and second steps.

In the first step, preferably, the ratio by mole (concentration) of ammonia gas (nitrogen source) to a Group III metal source (i.e., ammonia/Group III metal source ratio) is regulated to 1,000 or less. When this ratio is higher than 1,000, reaction between ammonia and the metal source proceeds considerably before these materials reach the substrate, and fine Group III metal particles may fail to be formed on the substrate. The ammonia/Group III metal source ratio may be zero; i.e., feeding of ammonia gas may be omitted, as the fine Group III particles are sufficiently nitridized in the second step, or nitrogen obtained through decomposition of a nitride (e.g., polycrystalline GaN), which is deposited onto the inner side walls and ceiling of the reactor, and onto the surface of the susceptor on which a substrate is to be placed, partially contributes to nitridation of the fine Group III metal particles deposited onto the first layer. In order to attain consistent quality of the first layer, preferably, the amount of a nitride, which is deposited onto the inner side walls and ceiling of the reactor, and onto the surface of the susceptor on which a substrate is to be placed, is maintained at a constant level. Therefore, preferably, the final step of the process for forming Group III nitride semiconductor layers is always completed under the same Group III nitride semiconductor growth conditions.

In some cases, only hydrogen or a gas mixture of hydrogen and ammonia gas is caused to flow through the reactor during heating. This process, which is called "baking," is carried out for the purpose of removing excess deposition products present in the reactor. After completion of baking, nitride deposits are removed from the reactor. Therefore, before formation of the first layer, preferably, a nitride layer formed of polycrystalline GaN is deposited in advance through growth on the inner side walls and ceiling of the reactor, and on the surface of the susceptor on which a substrate is to be placed.

The first step is preferably carried out at a temperature of 950 to 1,250° C. When the first step is carried out at a temperature higher than 1,250° C., fine Group III metal particles tend to disperse immediately after being deposited onto the surface of a substrate due to high temperature, and difficulty is encountered in forming the first layer. In contrast, when the first step is carried out at a temperature lower than 950° C., fine Group III metal particles are excessively deposited onto the surface of a substrate, which is not preferred. The first step is more preferably carried out at 1,000 to 1,200° C., more preferably at 1,000° C. to 1,170° C., particularly preferably at 1,040 to 1,120° C.

The second step is preferably carried out at a temperature of 1,050 to 1,250° C. When the second step is carried out at a temperature higher than 1,250° C., the fine Group III metal particles which have been deposited onto a substrate in the first step tend to disperse from the substrate, and control of the particles becomes difficult. In contrast, when the second step is carried out at a temperature lower than 1,050° C., nitridation of the fine Group III metal particles proceeds rapidly, and control of the nitridation becomes difficult. Needless to say, both cases are not preferred. The second step is more preferably carried out at 1,100 to 1,200° C., particularly preferably at 1,100 to 1,150° C.

In the case where the annealing step is carried out between the first and second steps, the annealing step is carried out at the temperature at the time when the first step is completed. This annealing step promotes distribution of the fine Group III metal particles, thereby forming fine Group III metal particles of more desirable shape.

The second step is followed by a third step of growing a Group III nitride semiconductor single crystal layer (e.g., an undoped GaN layer).

No particular limitations are imposed on the material of a substrate, and the substrate may be formed of any known material. Examples of the known material include oxide single crystals such as sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal. Preferably, a sapphire substrate or an SiC substrate is employed. No particular limitations are imposed on the crystal orientation of the substrate. However, when a sapphire substrate is employed, the crystal orientation is preferably C-plane ((0001) plane). Preferably, an axis perpendicular to the surface of the sapphire substrate is inclined by a specific angle with respect to the <0001> plane of the substrate.

EXAMPLE

The present invention will next be described in detail by way of an Example, which should not be construed as limiting the invention.

[Example]

Figure 5:
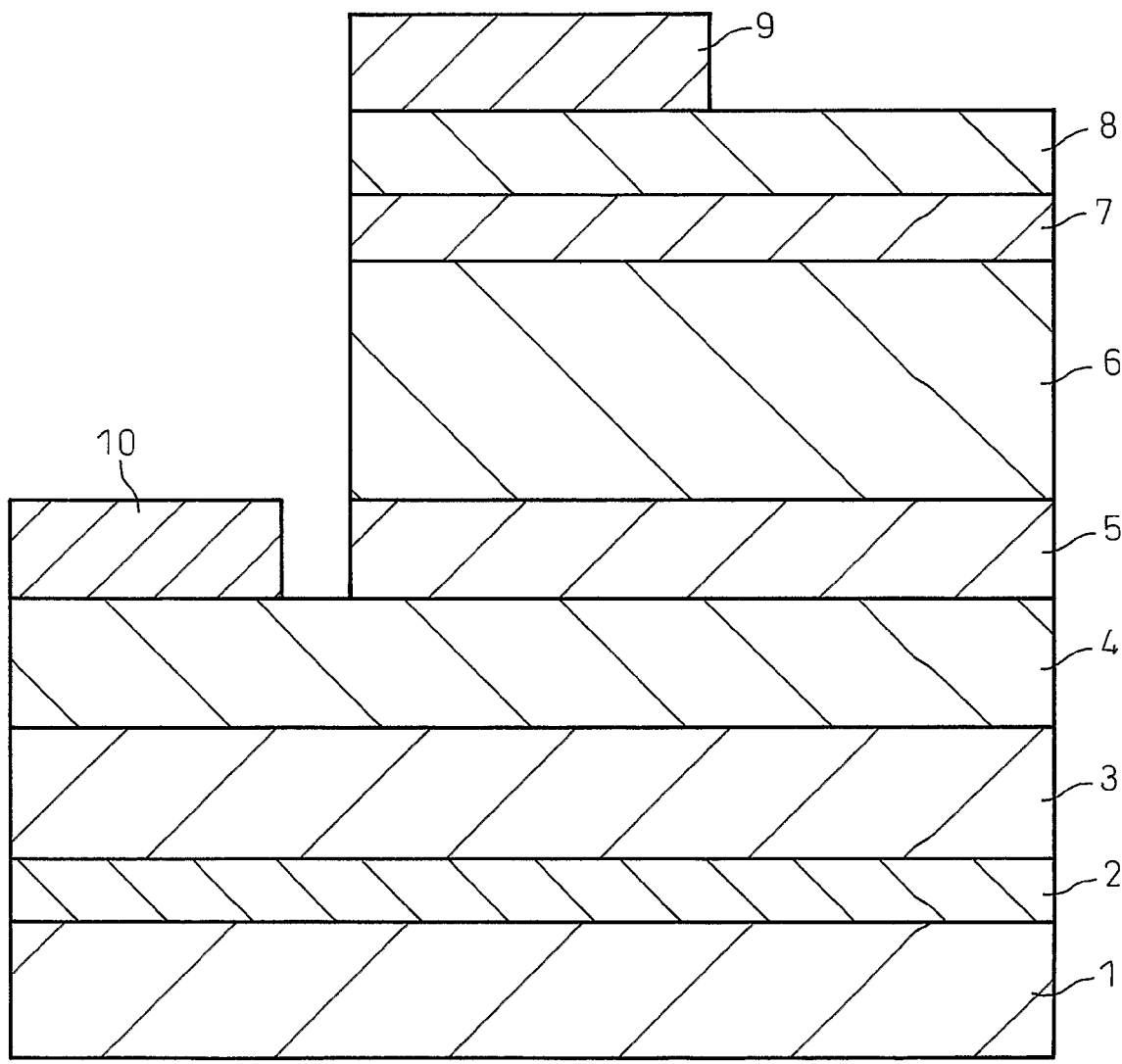
FIG. 5 is a schematic representation showing the Group III nitride semiconductor light-emitting device of the present invention produced in the Example.

FIG. 5 is a schematic representation showing the Group III nitride semiconductor light-emitting device of the present invention produced in the present Example. Reference numeral 1 denotes a substrate composed of sapphire. Semiconductor layers were grown along the crystal plane orientation of the substrate. A first layer 2 composed of $Al_{0.08}Ga_{0.92}N$ doped with Si ($5\times10^{18}$ atoms/cm$^3$) was formed on the substrate. A second layer 3 composed of an undoped GaN single crystal layer, and an n-type GaN single crystal layer 4 doped with Si ($1\times10^{19}$ atoms/cm$^3$) were successively formed on the first layer 2. A light-emitting layer 6 was formed, via a $Ga_{0.98}In_{0.02}N$ layer 5, on the Si-doped GaN single crystal layer 4. The $Ga_{0.98}In_{0.02}N$ layer 5 is provided between the Si-doped GaN layer 4 and the light-emitting layer 6 for preventing propagation of crystal defects from the Si-doped GaN layer 4.

The light-emitting layer 6 has a structure including a plurality of stacked layer units, each including a barrier layer composed of an undoped GaN layer and a well layer composed of a $Ga_{0.92}In_{0.08}N$ layer (i.e., a layer composed of GaN and InN). In the present Example, five layer units were laminated. The GaN barrier layer has a thickness of 75 nm, and the GaInN well layer has a thickness of 25 nm (total thickness: 100 nm). A barrier layer having a thickness of 75 nm was laminated on the outermost layer (well layer) of the layer units, to thereby form the light-emitting layer.

A p-type $Al_{0.1}Ga_{0.9}N$ layer 7 doped with Mg ($3\times10^{19}$ atoms/cm$^3$) and a p-type GaN layer 8 doped with Mg ($6\times10^{19}$ atoms/cm$^3$) were formed on the light-emitting layer. Reference numeral 9 denotes a positive electrode, which has a four-layer structure formed of successively laminated Au, Ti, Al, and Au layers. Reference numeral 10 denotes a negative electrode, which has a four-layer structure formed of successively laminated Ni, Al, Ti, and Au layers.

The Group III nitride semiconductor light-emitting device was produced through the following procedure. Firstly, a C-plane sapphire substrate was placed on a carbon-made susceptor provided in the center of a reactor of an MOCVD production apparatus. While the substrate was placed on the susceptor, nitrogen gas was caused to flow through the reactor. After the substrate was placed on the susceptor, the lid of the reactor was closed, and hydrogen gas was fed into the reactor for five minutes, to thereby completely replace the nitrogen gas contained in the reactor with hydrogen gas. Thereafter, while hydrogen gas was caused to flow through the reactor, the carbon-made susceptor was heated by means of an induction heating RF coil provided below the susceptor. Specifically, the temperature of the susceptor was elevated to 600° C. over six minutes, and subsequently, the temperature elevation operation was stopped when the susceptor temperature reached 600° C., and the susceptor temperature was maintained at 600° C. for 10 minutes.

(Formation of first layer 2)

After 10 minutes elapsed, the susceptor temperature was elevated from 600° C. to 1,040° C. over six minutes. When the temperature reached 1,040° C., TMAl, TMGa, and $SiH_4$ were fed into the reactor, to thereby initiate a first step of forming, on the substrate, a layer through deposition of Si-doped fine particles of Group III metals (Al and Ga). While the above raw materials were fed into the reactor, the susceptor temperature was elevated from 1,040° C. to 1,120° C. over five minutes. When the susceptor temperature reached 1,120° C., the temperature elevation was stopped, and the susceptor temperature was maintained at 1,120° C. for five minutes. The time for the first step is 10 minutes (i.e., total of the time for the temperature elevation from 1,040° C. to 1,120° C. (five minutes) and the time for maintaining the susceptor temperature at 1,120° C. (five minutes)). During the first step, the feed amounts of $SiH_4$, TMGa, and TMAl gases were regulated such that the ratio by mole (concentration) of Si to (Ga+Al) became $10^{-4}$, and the first layer formed on the substrate was doped with a predetermined amount of Si (the feed amounts of these raw material gases had been predetermined on the basis of the results of SIMS analysis, which results indicate that when the ratio by mole of Si to (Ga+Al) satisfies the above value, the Si content of the first layer becomes $5 \times 10^{18}$ atoms/cm$^3$).

Ten minutes after the start of the first step, feeding of TMAl, TMGa, and $SiH_4$ was stopped. Subsequently, while the susceptor temperature was maintained at 1,120° C., only hydrogen gas, serving as a carrier gas, was fed into the reactor, and an annealing treatment was initiated. This annealing treatment is performed for the purpose of promoting distribution of the fine Group III metal particles deposited onto the substrate, thereby forming fine Group III metal particles of more desirable shape. The annealing treatment was performed for three minutes.

After the above annealing treatment had been performed for three minutes, ammonia gas was fed into the reactor, and a second step; i.e., an annealing treatment under a stream of ammonia gas, was initiated. This annealing treatment is performed for the purpose of completely nitridizing non-nitridized, fine Group III metal particles. The annealing treatment was performed for eight minutes. After eight minutes elapsed, the susceptor temperature was lowered from 1,120° C. to 1,040° C. over two minutes. Meanwhile, the feed amount of ammonia gas was changed from 15 L/minute to 12 L/minute.

(Formation of undoped GaN layer 3 and Si-doped GaN layer 4)

Thereafter, the susceptor temperature was confirmed to be 1,040° C., and TMGa was fed into the reactor, to thereby initiate growth of the undoped GaN layer on the first layer. The feed amount of TMGa was regulated such that the rate of growth of the GaN layer became 2.0 μm/hour. After growth of the undoped GaN layer was performed for one hour, a valve for feeding $SiH_4$ was opened, and growth of the Si-doped GaN layer was initiated. The feed amount of $SiH_4$ was regulated such that the ratio by mole of Si to Ga became $10^{-4}$.

After growth of the Si-doped GaN layer was performed for one hour, the valves for feeding TMGa and $SiH_4$ were closed, and feeding of these materials was stopped, to thereby stop growth of the Si-doped GaN layer. Meanwhile, feeding of ammonia was continued. Thereafter, the hydrogen carrier gas was completely replaced by a nitrogen carrier gas, and the susceptor temperature was lowered from 1,040° C. to 755° C. over seven minutes. During the course of this temperature lowering, the feed amounts of TMIn and TEGa, which are employed for growth of the GaInN layer 5, were regulated. Meanwhile, the feed amount of $SiH_4$ was regulated such that the ratio by mole of Si to Ga became $10^{-5}$.

The undoped GaN layer and the Si-doped GaN layer were found to have a thickness of 2.0 μm (i.e., total of the thicknesses of these layers was found to be 4.0 μm). The Si content of the Si-doped GaN layer was found to be $1 \times 10^{19}$ atoms/cm$^3$.

(Formation of $Ga_{0.98}In_{0.02}N$ layer 5)

After seven minutes had elapsed, the susceptor temperature was confirmed to be maintained at 755° C. Subsequently, valves for feeding TEGa, TMIn, and $SiH_4$ were opened, and these materials were fed into the reactor, to thereby initiate growth of the $Ga_{0.98}In_{0.02}N$ layer under nitrogen carrier gas flow. After 50 minutes had elapsed, the valves for feeding TEGa, TMIn, and $SiH_4$ were closed, and growth of the $Ga_{0.98}In_{0.02}N$ layer was stopped. The resultant $Ga_{0.98}In_{0.02}N$ layer was found to have a thickness of 25 nm, and to be doped with Si in an amount of $3 \times 10^{18}$ atoms/cm$^3$.

(Formation of light-emitting layer 6)

Subsequently, there was repeated the following procedure: a valve for feeding TEGa is opened, and a barrier layer composed of an undoped GaN layer is grown; a valve for feeding TMIn is opened when the thickness of the barrier layer becomes 75 nm, to thereby feed TMIn into the reactor and grow a well layer composed of a $Ga_{0.92}In_{0.08}N$ layer; and the valve for feeding TMIn is closed when the thickness of the $Ga_{0.92}In_{0.08}N$ well layer becomes 25 nm. Specifically, the above combined procedure was carried out five times, to thereby laminate five barrier layers and five well layers alternately. A barrier layer was grown on the outermost well layer of the thus-formed laminate.

(Formation of Mg-doped $Al_{0.1}Ga_{0.9}N$ layer 7)

Through valve switching, the nitrogen carrier was replaced with a hydrogen carrier gas. The susceptor temperature was elevated from 755° C. to 1,020° C. over four minutes. During the course of this temperature elevation, the feed amounts of TMGa, TMAl, and $Cp_2Mg$ were regulated through control of mass flow controllers for these materials. In this case, the feed amounts of TMGa and TMAl gases were regulated such that the ratio by mole of Al to Ga became 0.2. Meanwhile, the feed amount of $Cp_2Mg$ was regulated such that the ratio by mole of Mg to Ga became 0.25. After the susceptor temperature was confirmed to be maintained at 1,020° C., valves for feeding TMGa, TMAl, and $Cp_2Mg$ were opened, and growth of the Mg-doped AlGaN layer was initiated. After the layer growth was performed for one minute, the valves for feeding TMGa, TMAl, and $Cp_2Mg$ were closed, whereby growth of the layer was stopped. The resultant Mg-doped AlGaN layer was found to have a thickness of 10 nm and an Mg content of $3 \times 10^{19}$ atoms/cm$^3$.

(Formation of Mg-doped GaN layer 8)

Subsequently, the feed amounts of TMGa and $Cp_2Mg$ were regulated through control of mass flow controllers for these materials. In this case, the feed amounts of TMGa and $Cp_2Mg$ gases were regulated such that the ratio of Mg to Ga became 0.5. Regulation of the feed amounts of these materials was continued for two minutes until the Mg/Ga ratio became constant. Thereafter, valves for feeding TMGa and Cp$_2$Mg were opened, to thereby grow the Mg-doped GaN layer having a thickness of 0.1 µm and an Mg content of 6×10$^{19}$ atoms/cm$^3$.

After completion of growth of the Mg-doped GaN layer, application of electricity to the induction heating RF coil was stopped, to thereby lower the susceptor temperature from 1,020° C. to room temperature over 20 minutes. After initiation of the temperature lowering, the carrier gas composition was changed to 100% nitrogen gas, and the feed amount of ammonia was reduced to ¹⁄₁₀₀ of that during the course of growth of the Mg-doped GaN layer. When the susceptor temperature was lowered to 300° C., feeding of ammonia was stopped; i.e., only nitrogen gas was caused to flow through the reactor. When the susceptor temperature was lowered to room temperature, the resultant wafer was removed from the reactor into the air. The entire surface of the wafer was found to have a mirror surface. The Mg-doped GaN layer exhibited p-type conductivity without annealing treatment for activation. Thus, the wafer was produced by forming the Group III nitride semiconductor epitaxial layers on the sapphire substrate.

The structure of the first layer of the wafer was observed under an electron microscope at a magnification of 500,000. FIG. 1 is a micrograph showing the cross section of the first layer, and FIG. 2 is a schematic representation of the micrograph shown in FIG. 1. Observation of the first layer revealed that the layer was a polycrystalline layer formed of aggregated of columnar crystal grains having a width falling within a range of 30 to 50 nm, and that the maximum difference in height between protrusions and depressions present at the surface of the first layer (i.e., the interface between the first layer and the undoped GaN layer) was about 30 nm.

By use of the wafer produced through the above-described procedure, the Group III nitride semiconductor light-emitting device was produced through the following procedure. Firstly, by means of lithography, a technique which is well known in the art, a translucent gold electrode layer was formed on the surface of the Mg-doped GaN layer, and a titanium layer, an aluminum layer, and a gold layer were successively laminated on the electrode layer, to thereby form an electrode bonding pad. They serve as a positive electrode. Subsequently, the wafer was subjected to dry etching until a portion of the Si-doped GaN layer was exposed to the outside. On the thus-exposed portion, a nickel layer, an aluminum layer, a titanium layer, and a gold layer were successively laminated, to thereby form a negative electrode.

The back surface of the sapphire substrate of the wafer including the above-formed positive and negative electrodes was subjected to grinding until the thickness of the wafer became a predetermined level and, subsequently, the thus-ground back surface was subjected to polishing such that the back surface became a mirror surface. The resultant wafer was cut into chips, each having a size of 350 µm×350 µm and including one positive electrode and one negative electrode. The resultant chip was fixated on a stem such that the positive and negative electrodes faced upward, and the chip was connected to a lead frame by means of a gold wire, to thereby produce the light-emitting device.

When a forward current of 20 mA was caused to flow between the positive and negative electrodes of the light-emitting device, the device exhibited a forward voltage of 3.2 V, emitted light having a wavelength of 460 nm, and exhibited an emission output of 6 cd. When a reverse current of 10 µA was caused to flow between the positive and negative electrodes of the light-emitting device, the reverse withstand voltage was found to be 16 V.

COMPARATIVE EXAMPLE

The procedure of the Example was repeated, except that the first step of forming the first layer was performed without feeding of SiH$_4$, to thereby produce a light-emitting device.

Figure 3:
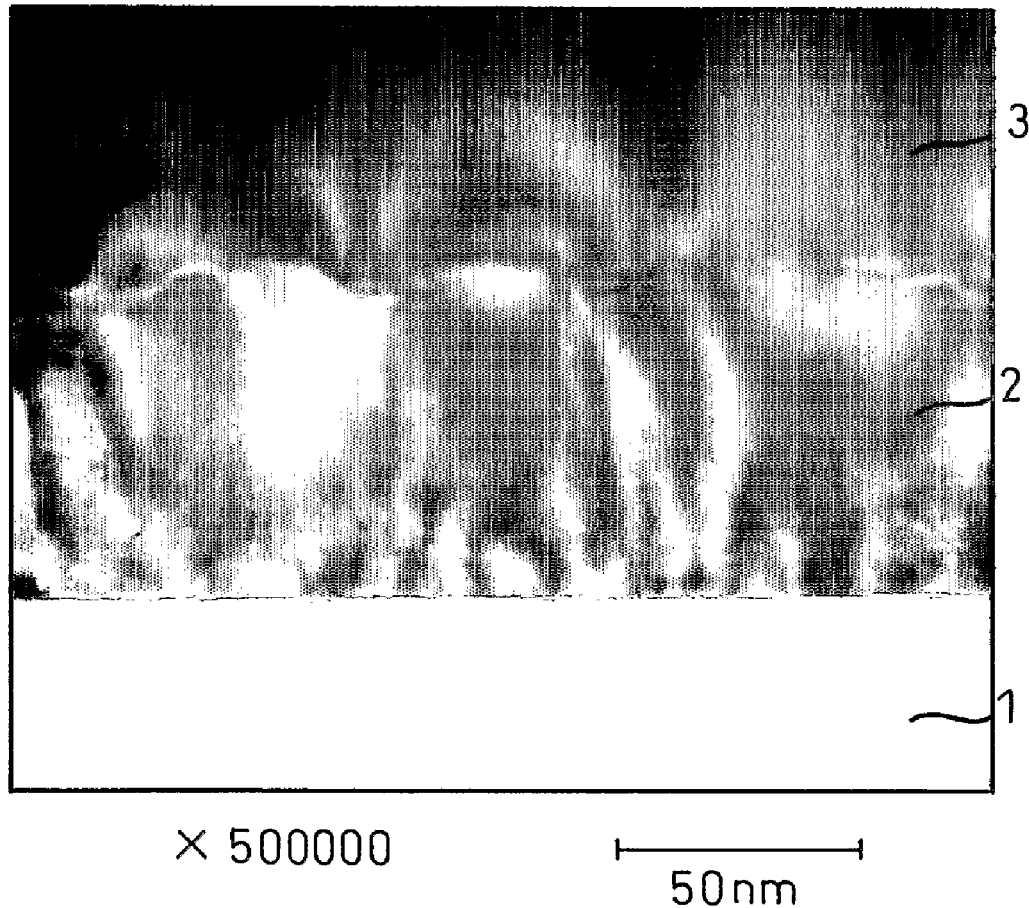
FIG. 3 is an electron micrograph showing the cross section of the Group III nitride semiconductor light-emitting device of Comparative Example.
Figure 4:
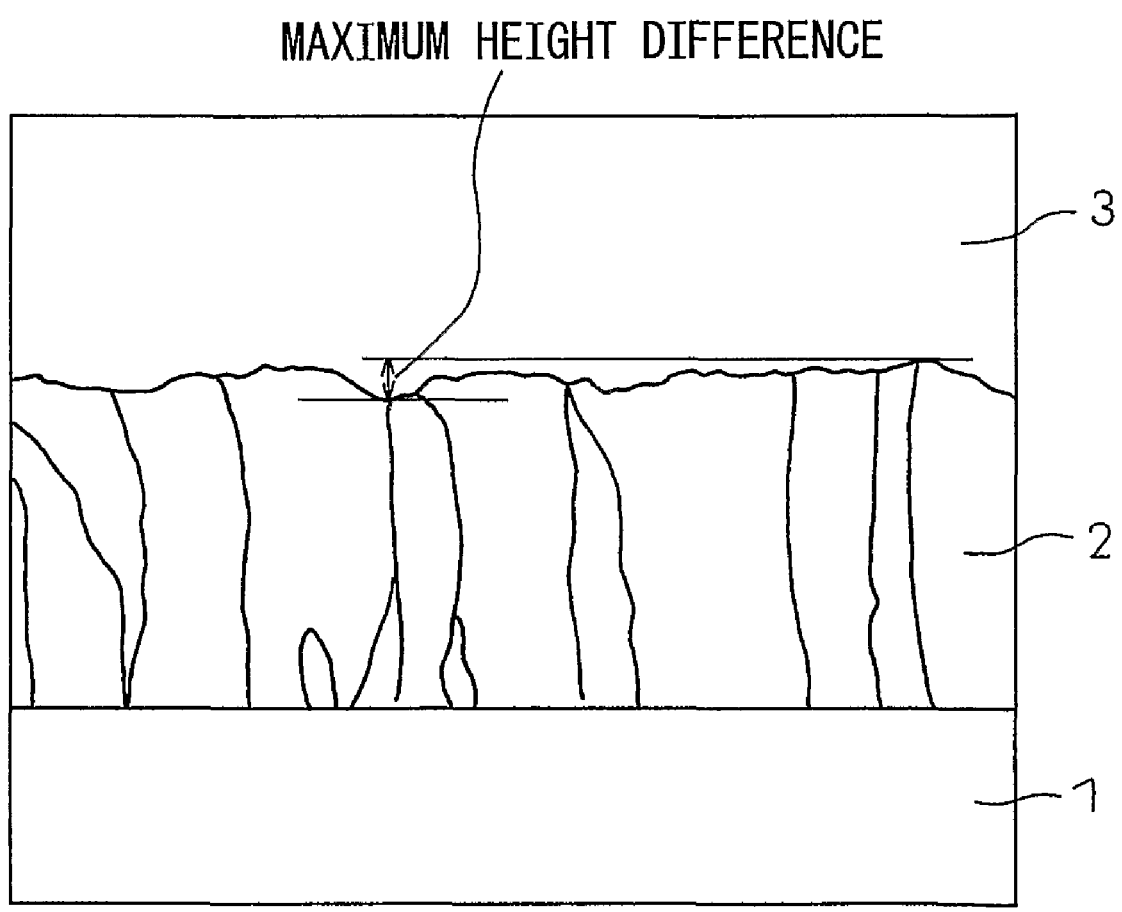
FIG. 4 is a schematic representation of the micrograph shown in FIG. 3.

In a manner similar to that of the Example, the first layer of the thus-produced light-emitting device was observed under an electron microscope. FIG. 3 is a micrograph showing the cross section of the first layer, and FIG. 4 is a schematic representation of the micrograph shown in FIG. 3. Observation of the first layer revealed that the layer was a polycrystalline layer formed of aggregated columnar crystal grains having a width falling within a range of 30 to 50 nm, and that the maximum difference in height between protrusions and depressions present at the surface of the first layer (i.e., the interface between the first layer and the undoped GaN layer) was as small as 10 nm or less.

When a forward current of 20 mA was caused to flow between the positive and negative electrodes of the light-emitting device, the device exhibited a forward voltage of 3.2 V, emitted light having a wavelength of 460 nm, and exhibited an emission output of 6 cd. When a reverse current of 10 µA was caused to flow between the positive and negative electrodes of the light-emitting device, the reverse withstand voltage was found to be 10 V.

INDUSTRIAL APPLICABILITY

When the Group III nitride semiconductor device of the present invention is employed in a light-emitting device (e.g., a light-emitting diode or a laser diode) or an electronic device, the resultant device can attain very high efficiency. Therefore, the Group III nitride semiconductor device has very high industrial utility value.

The invention claimed is:

1. A Group III nitride semiconductor device comprising: a sapphire substrate; and
a plurality of Group III nitride semiconductor layers provided on the substrate,
wherein a first layer which is in contact with the substrate is composed of silicon-doped Al$_x$Ga$_{1-x}$N (0<x≦1) and has a structure formed of aggregated columnar crystal grains having a width of 10 to 50 nm.

2. A Group III nitride semiconductor device according to claim 1, wherein the first layer contains silicon in an amount of 1×10$^{16}$ to 1×10$^{19}$ atoms/cm$^3$.

3. A Group III nitride semiconductor device comprising: a substrate; and
a plurality of Group III nitride semiconductor layers provided on the substrate, including a first layer which is in contact with the substrate and a second layer grown on said first layer,
wherein said first layer which is in contact with the substrate is composed of Al$_x$Ga$_{1-x}$N (0≦x≦1), and the difference in height between a protrusion and a depression which are present at the interface between the first layer and the second layer is 10 nm or more and is equal to, or less than, 99% the thickness of the first layer.

4. A Group III nitride semiconductor device according to claim 1, wherein the first layer has a thickness of 20 nm to 200 nm.

5. A Group III nitride semiconductor light-emitting device comprising:
   a substrate;
   an n-type layer, a light-emitting layer, and a p-type layer, which are composed of a Group III nitride semiconductor single crystal and are provided on the substrate in this order;
   a negative electrode provided on the n-type layer; and
   a positive electrode provided on the p-type layer,
   wherein there is a layer composed of silicon-doped $Al_xGa_{1-x}N$ ($0 < x \leq 1$) in contact with the substrate and the layer in contact with the substrate has a structure formed of aggregated columnar crystal grains having a width of 10 to 50 nm.

6. A method for producing a Group III nitride semiconductor device comprising a sapphire substrate, and a plurality of Group III nitride semiconductor layers provided on the substrate, wherein a first layer which is in contact with the substrate is composed of silicon-doped $Al_xGa_{1-x}N$ ($0 < x < 1$) and has a structure formed of aggregated columnar crystal grains having a width of 10 to 50 nm, which method comprises a first step of depositing, on the surface of the substrate, a layer containing fine Group III metal particles containing silicon; a second step of nitridizing the fine particles in an atmosphere containing a nitrogen source; and a third step of growing a Group III nitride semiconductor single crystal on the thus-nitridized fine particles.

7. A method for producing a Group III nitride semiconductor device according to claim 6, which further comprises, between the first and second steps, an annealing step of heating the fine particles in an atmosphere containing hydrogen gas and/or nitrogen gas.

8. A Group III nitride semiconductor device according to claim 1, wherein the first layer is composed of silicon-doped $Al_xGa_{1-x}N$ ($0 < x < 1$).

9. A Group III nitride semiconductor light-emitting device according to claim 5, wherein the layer in contact with the substrate is composed of silicon-doped $Al_xGa_{1-x}N$ ($0 < x < 1$).

10. A Group III nitride semiconductor device according to claim 1, wherein the columnar crystal grains have a width of 20 to 40 nm.

11. A Group III nitride semiconductor device according to claim 1, wherein the first layer is a continuous layer formed by a continuous formation of the columnar crystal grains.

12. A Group III nitride semiconductor device according to claim 3, wherein the thickness of the first layer is a thickness of a thickest portion of the first layer which has a maximum height of the first layer.

13. A Group III nitride semiconductor device according to claim 3, wherein the difference in height between the protrusion and the depression is a maximum height difference between a maximum protrusion and a maximum depression of an upper surface of the first layer.

14. A Group III nitride semiconductor device according to claim 13, wherein the maximum protrusion and the maximum depression of the upper surface of the first layer is a thickest portion and a least thickest portion of the first layer, respectively.

15. A Group III nitride semiconductor device according to claim 14, wherein the thickness of the first layer is the thickest portion of the first layer having a maximum height.

16. A Group III nitride semiconductor device according to claim 14, wherein the difference in height between the protrusion and the depression is 40 nm or less.

17. A Group III nitride semiconductor device according to claim 14, wherein the columnar crystal grains have a width of 20 to 40 nm.

18. A Group III nitride semiconductor device according to claim 3, wherein the difference in height between the protrusion and the depression is 10 nm or more and is equal to, or less than, 90% the thickness of the first layer.

19. A Group III nitride semiconductor device according to claim 3, wherein the difference in height between the protrusion and the depression is 60 nm or less.

20. A Group III nitride semiconductor device according to claim 3, wherein the difference in height between the protrusion and the depression is 40 nm or less.

* * * * *